United States Patent Office 3,542,756
Patented Nov. 24, 1970

3,542,756
ERROR CORRECTING

Robert Gray Gallager, Lexington, Mass., assignor to Codex Corporation, Watertown, Mass., a corporation of Delaware Filed Feb. 7, 1968, Ser. No. 703,749
Int. Cl. G06f *11/12*
U.S. Cl. 340—146.1 5 Claims

ABSTRACT OF THE DISCLOSURE

Shown is an embodiment of a burst error correcting decoder for a cyclic code that produces syndrome sequences for the received data blocks, and has logic for evaluating the syndromes. The logic device locates and selects an appropriate run of consecutive zero syndrome digits in each syndrome sequence, the runs including at least some runs shorter than a specified limit. Those syndrome digits which immediately follow the selected run of zeros are combined with respective received digits.

Also shown is an embodiment of the logic device which includes a plurality of cooperating counters adapted to determine which of two or more runs of consecutive zero syndrome digits is longest.

This invention relates to decoding cyclic codes.

The primary object of the invention is to provide for cyclic codes and decoding technique having improved error correcting capability for error bursts of lengths between $b'$ and $N-K$, where N is a code block and K is the number of information digits in the block, and $b'$ is the maximum guaranteed correctible burst length of the code (i.e. the length such that no decoder is capable of correcting *all* bursts up to and including any longer length). The length of an error burst is the number of digits between (and including) the first and last digits in which the received sequence and the code word differ (see FIG. 1).

In general, the invention provides means for producing an N-digit syndrome sequence for each received block, and a locator for locating and selecting an appropriate run of consecutive zero syndrome signals (preferably the *longest* run not wholly contained between positions K and $N-1$) occurring in such a syndrome sequence. The locator is constructed to operate in a range including consecutive syndrome zero runs shorter than $N-K-b'$. Logic circuitry treats the received block as containing an error burst in the digits corresponding to the syndrome digits immediately following the selected run of zeros, and the syndrome and received digits are combined accordingly to produce the desired correction. In preferred embodiments a plurality of cooperating counters is arranged so that one counter counts the length of a first run of zeros encountered in the syndrome sequence, and a second counter receives the first count and counts down therefrom in stepped relation to the length of a second run of zeros, indicating which run is longer. When the second run is longer, the first counter resumes counting after the first run has been fully counted down, through the remaining portion of the second run. By repeating such operations with succeeding runs of zeros, the length of the longest run will eventually be made to appear on the first counter.

Other objects, features, and advantages will appear from the following description of a preferred embodiment of the invention, taken together with the attached drawings thereof, in which.

A cyclic code is a parity check code which has the property that if any code word is cyclicly shifted, the result is another code word. A cyclic code of block length N with K information digits is most easily specified by its generator polynomial, $g(t)=g_0+g_1t+ \cdot\cdot\cdot g_{N-K}t^{N-K}$, in which the coefficients $g_i$ are elements of a Galois field, with $g_{N-K}=1$ and $g_0\neq 0$. For binary codes, which have the most immediate practical interest, the $g_i$ are binary, either 0 or 1. To generate a cyclic cide, $g(t)$ must be a factor of $t^N-1$; that is, there is a polynomial $h(t)$, called the parity check generator, such that $g(t)h(t)=t^N-1$. The polynomial multiplication here is of the usual sort except that the coefficients are multiplied and added by Galois field operations.

Each code word in a cyclic code is a sequence of N digits, say $x_0, x_1 \cdot\cdot\cdot, x_{N-1}$. We can represent these code words by polynomials, $x(t)=x_0+x_1t+ \cdot\cdot\cdot +x_{N-1}$. The code words are related to the generator polynomial by the relation $x(t)=a(t)g(t)$ where $a(t)$ is a polynomial of degree $K-1$ or less. As $a(t)$ runs through all such polynomials (with coefficients in the Galois field), $x(t)$ runs through all the code words in the code.

A cyclic shift of $x(t)$ is now $tx(t)$ where from this point on all polynomial multiplications are taken modulo $t^{N-1}$. In other words, $tx(t)$ is $$x_{N-1}+x_0t+x_1t^2+ \cdot\cdot\cdot +x_{N-2}t^{N-1}$$

To see that this is a code word, we can write $ta(t)$ as $a_{K-1}h(t)+r(t)$ where $r(t)$ is of degree $K-1$ or less. Then $$\begin{aligned}tx(t)&=ta(t)g(t)\\&=a_{K-1}h(t)g(t)+r(t)g(t)\\&=a_{K-1}t^{N-1}+r(t)g(t)=r(t)g(t)\end{aligned}$$

Thus a cyclic shift of $x(t)$ is another code word. By the same argument, $x(t)h(t)=0$ (1)

Writing out each term in this polynomial multiplication, we have $$\sum_{i=0}^{K} h_ix_{j-i}=0; j=0 \ldots, N-1 \quad (2)$$

Using the fact that $h_K=1$, this gives as a recursion formula for computing the parity checks of $x(t)$ from the information digits $x_0 \cdot\cdot\cdot, x_{K-1}$.

$$x_j=\sum_{i=1}^{K}-h_ix_{j-i}; j=K, \ldots, N-1 \quad (3)$$

Figure 1:
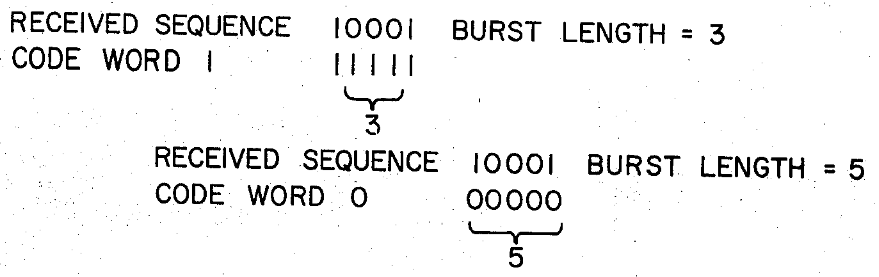
FIG. 1 is a diagrammatic illustration of burst length.
Figure 2:
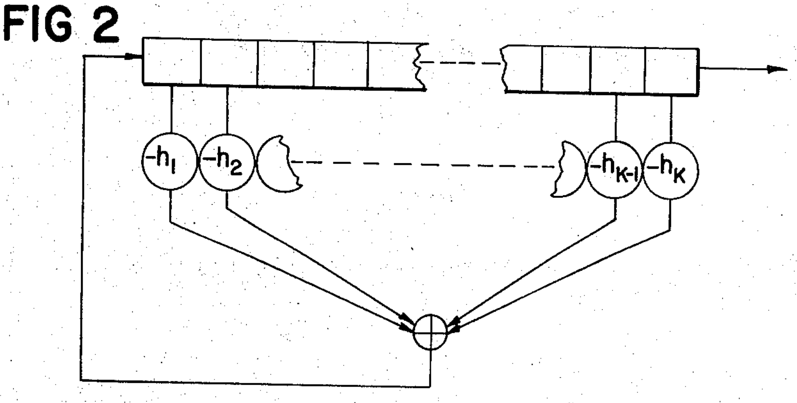
FIG. 2 shows an encoding circuit for a cyclic code.

FIG. 2 shows a circuit for performing this calculation. The K information digits are initially loaded into the shift register in order with $x_0$ at the right. Then the register is shifted right, $x_0$ goes out on the channel, and $$x_K=\sum_{i=1}^{K}-h_ix_{K-i}$$

enters the shift register at the left. On each succession shift a new check digit is calculated.

For a more complete description of cyclic codes, see Peterson, Error Correcting Codes (MIT, Wiley, 1961).

Suppose that the code word $x(t)$ is transmitted and that the burst of errors, $e(t)=e_0+e_1t+ \ldots +e_{N-1}t^{N-1}$ occurs. The received sequence is then $y(t)=x(t)+e(t)$. Define the syndrome polynomial $s(t)$ by $$s(t)=y(t)h(t) \quad (4)$$

Using (1), this is equivalent to $$s(t)=x(t)h(t)+e(t)h(t) \quad (5)$$

$$=e(t)h(t) \quad (6)$$

Expanding this polynomial, as in (2), we get $$sj=\sum_{i=0}^{K} h_i e_{j-i}$$

Now suppose $e(t)$ is a burst of length $b<N-K$, going from position L to position $L+b-1$ with $e_L\neq 0$, $e_{L+b-1}\neq 0$. This is represented graphically in FIG. 3 with the shaded area representing the burst and the unshaded area positions where $e_i=0$. It can be seen from (7) that $s(t)$ will also have the form of a burst, but the burst will have length $b+K$ with $s_L\neq 0$ and $s_{L+b-1+K}\neq 0$ (see FIG. 3). The important point here is that the $N-K-b$ coefficients of $s(t)$ given by $s_{L-1}, s_{L-2} \ldots s_{L-N+K+b}$ must all be 0.

The decoding strategy is now to compute the coefficients of $s(t)$ from (4) and search for the longest string of consecutive zeros in this sequence of coefficients, considering $s_{N-1}$ to be connected cyclicly to $s_0$. Choosing L and $b$ so that this sequence of zeros is in positions $L-1$, $L-2 \ldots, L-N+K+b$, we assume the burst of errors to be in positions $L, L+1 \ldots L+b-1$. The error sequence can then be calculated from (7) as $$e_L=\frac{s_L}{h_0}$$

$$e_{L+1}=\frac{s_{L+1}-e_L h_i}{h_0}$$

$$e_{L+j}=\frac{s_{L+j}-\sum_{i=1}^{j} e_{L+j-}h_i}{h_0}$$

$$e_{L+b}-1=\frac{s_{L+b-1}-\sum_{i=1}^{b-1} e_{L+b-1-i}h_i}{h_0}$$

This computed error sequence then satisfies (7) for $N-K$ consecutive values of $j$ going from $L-N+K+b$ to $L+b-1$. The decoded sequence, $x'(t)=y(t)-e(t)$ will then satisfy (2) for $N-K$ consecutive values of $j$, and thus a cyclic shift of $x'(t)$ will satisfy (3). Given this cyclic shift of $x'(t)$ is a code word, $x'(t)$ is a code word, and the decoder has found a code word differing from $y(t)$ in a burst of $b$ digits. Since $N-K-b$ is the longest run of zeros in $s(t)$, no other code word differs from $y(t)$ in a shorter burst.

The preceding argument shows that if $s(t)$ contains a string of $N-K-b$ consecutive zeros, then a code word can be found differing from the received word in a burst of $b$. The only difficulty is that this burst might lap cyclicly around the end of the sequence. It can be verified that the burst will lap around the end of the sequence if and only if the sequence of zeros is wholly contained between positions K and $N-1$ inclusive.

Figure 3:
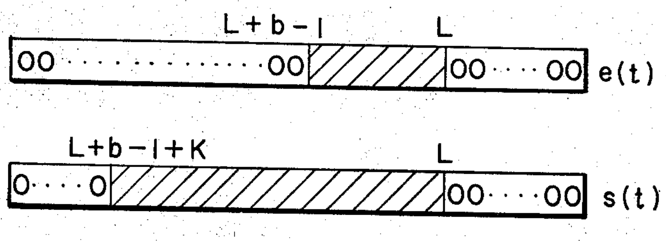
FIG. 3 is a diagrammatic illustration of an error burst in a received sequence and the corresponding burst in the syndrome sequence.

To summarize the preceding results, the code word that differs from the reecived sequence in the shortest burst can be found by calculating $s(t)$ from the received sequence, finding the longest string of zeros in $s(t)$ that is not wholly contained between K and $N-1$, and assuming that the burst of errors is adjacent to this longest sequence as shown in FIG. 3.

The technique just outlined is useful primarily on noisy communication channels where the noise typically occurs in bursts with any given burst of one length being more probably than any noise burst of a longer length. It can be seen that on such a channel, a decoding scheme that works in this way will decode correctly unless the actual noise burst is so long that there is another burst of shorter or equal length which when added to the received sequence yields a different code word. It can be shown that, for binary codes, $$b'\leq\frac{N-K}{2}$$

and that for bursts $b>b'$, the fraction of bursts uncorrected by the present technique is upper bounded by the smaller of $N2^{-b'}$ and $N2^{-[N-K-b]}$. For $N-K$ very large, this means that most bursts of length almost up to $2b'$ will be corrected.

Figure 10:
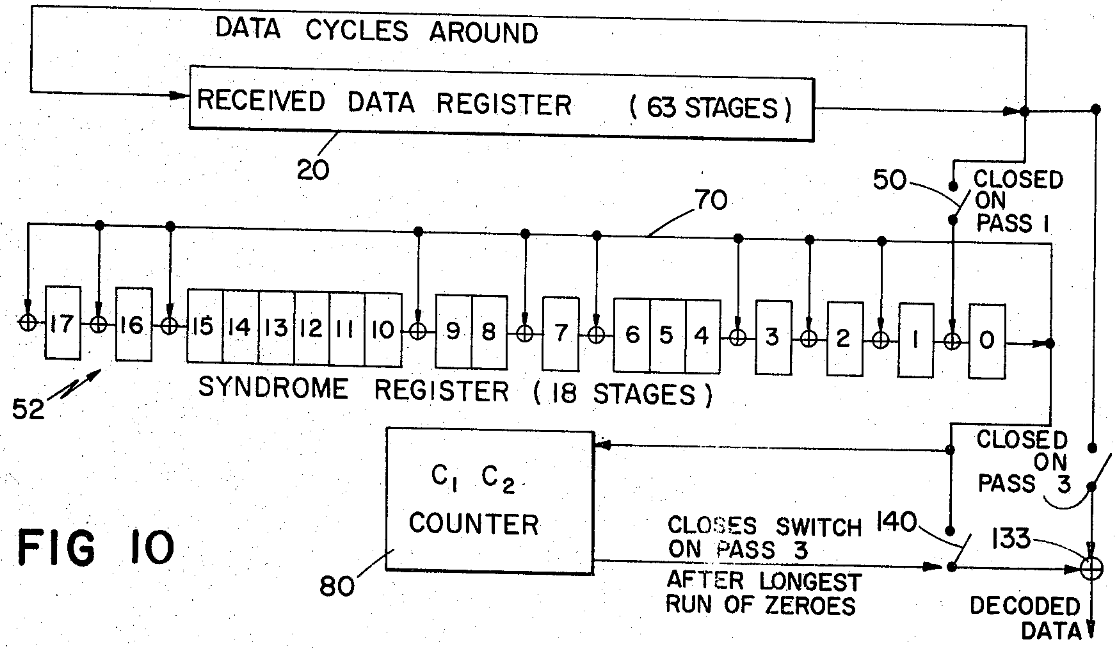
FIG. 10 is a diagram showing the operation of the circuitry of FIG. 4.

A circuit diagram is given in FIGS. 4–8 to show how these operations can be mechanized, and the operations are illustrated diagrammatically in FIG. 10. The particular realization is for a binary cyclic code of block length $N=63$ with $K=45$ information digits and the logical elements used are Computor Control Company S-PAC digital logic modules. That manufacturer's block diagrams are employed to indicate the proper wiring terminals, and the modules are designated according to the manufacturer's nomenclature (e.g. FA, SR, UF). The received sequence is read into the received data register 20 (FIGS. 8 and 10) at the beginning of the decoding cycle.

The digits $y_j$ of the received sequence are respectively read into the 63 flip-flops 22 of received data register 20 through input lines 24*b* and nand gates 24 upon receipt of a load pulse from main counter 28 (FIGS. 4, 5) on line 26. The load pulse is applied through parallel inverting amplifiers 30 (FIG. 8) and changes the voltage at terminals 24*a* of gates 24 from 0 v. (logical state zero) to −6 v. (logical state 1). Gates 24 operate so that the output at terminal 24*c* is a logical 1 (−6 v.) except when the inputs at terminals 24*a* and 24*b* are both 1.

Figure 4:
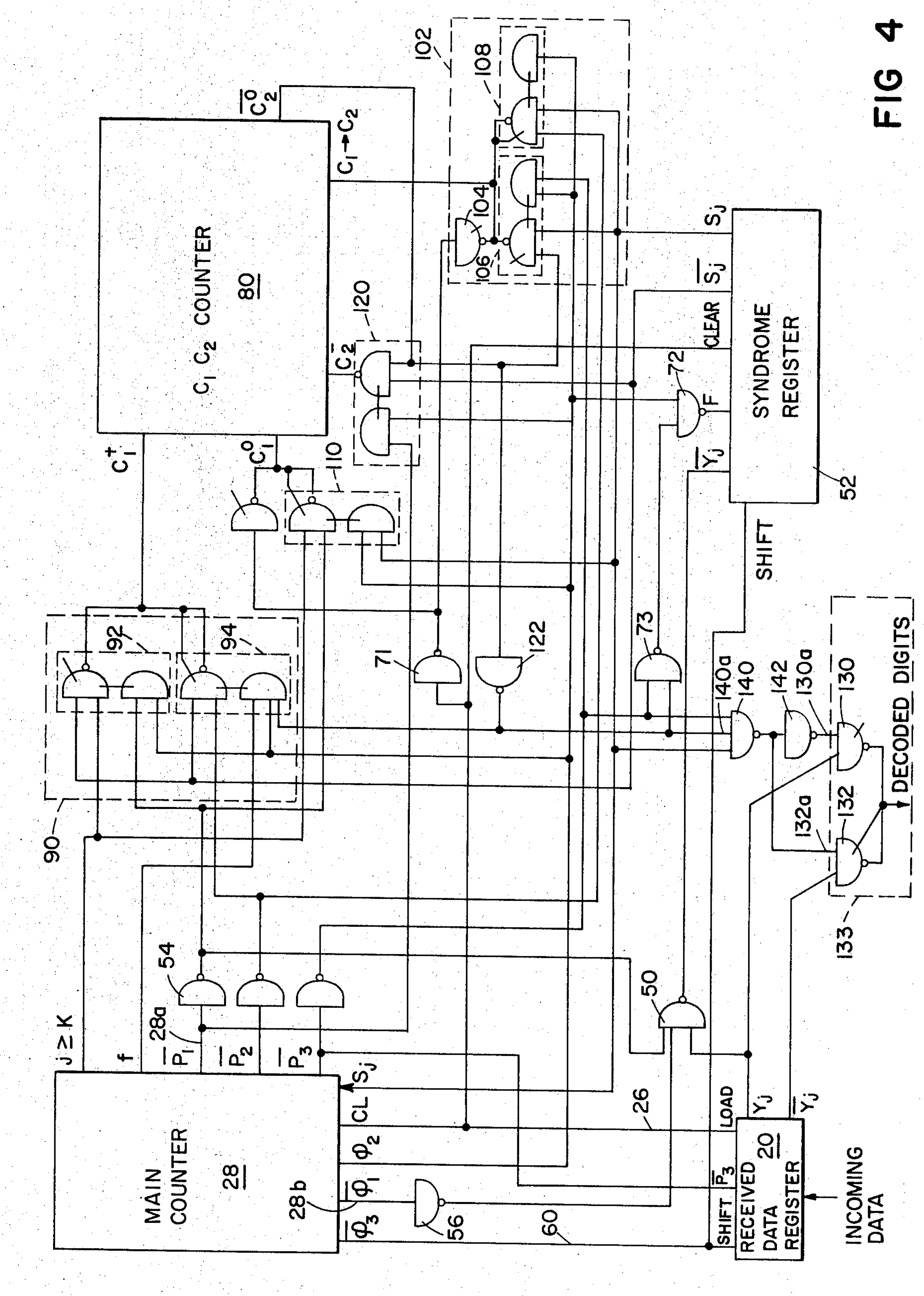
FIG. 4 is a diagram of circuitry embodying the present invention.
Figure 5:
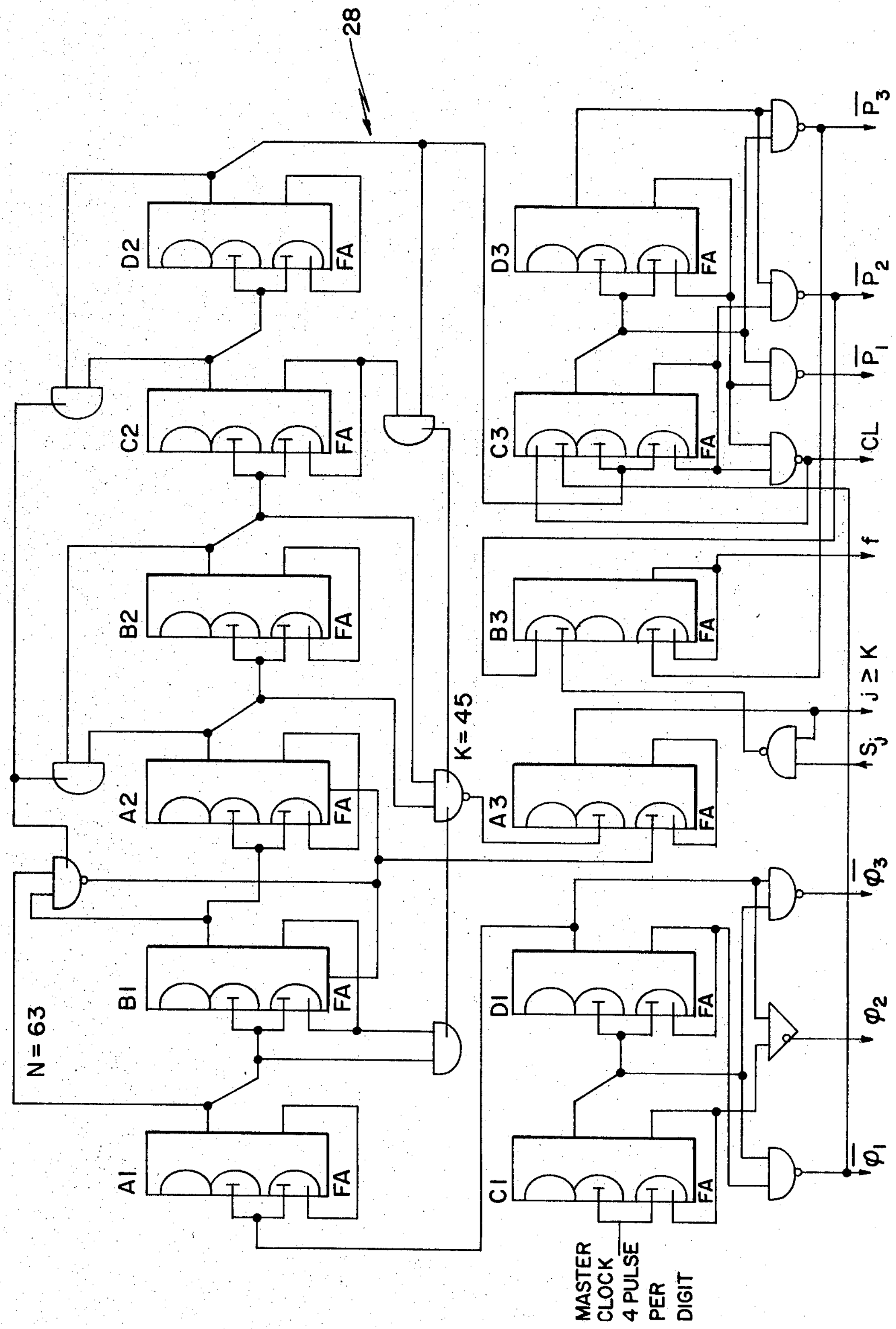
FIG. 5 is a circuit diagram of the main counter component of the circuitry of FIG. 4.

The digits $y_j$ are then cycled around in register 20 in three complete passes $P_1$, $P_2$, $P_3$ of 63 shifts each. Within each pass, the operations on each of the 63 digits are divided into four phases $\phi_0$, $\phi_1$, $\phi_2$, $\phi_3$. The timing of the passes and phases is accomplished by main counter 28 (FIGS. 4, 5).

During each operation in pass 1, the digit $y_j$ stored in the final stage (at the right in FIG. 8) of register 20 is, during phase 1, transmitted through switch 50 to the syndrome register 52. During phase 3 the $y_j$ in each stage of register 20 shifts to the right one stage (with the $y_j$ in the final stage shifting to the first stage). The shifting is triggered by a pulse from counter 28 over line 60 through non-invertng amplifiers 62. As before, the notation $\phi_3$ identifies the terminal of counter 28 involved and reflects the fact that its logical state is 1 (i.e. −6 v.) except during phase 3, when it is 0. During phases 0 and 2 no changes occur in register 20. Switch 50 is a nand gate the three inputs of which are connected respectively to terminal 22*a* of the final stage of register 20 (terminal 22*a* reads $y_j$), to terminal 28*a* of counter 28 through inverter 54 (terminal 28*a* reads 0 only during pass 1, hence the notation $\overline{P}_1$ and the use of inverter 54 to present a 1 to gate 50), and to terminal 28*b* of counter 28 through inverter 56 (terminal 28*b* reads 0 only during phase 1).

Thus, during pass 1, all 63 received digits $y_j$ are fed into syndrome register 52, while also being shifted through a complete cycle in register 20.

Syndrome register 52 (FIGS. 4, 7, 10) has eighteen flip-flop stages. Stages 4, 5, 8, 10–14 are FA modules wired for simple shift register operations generally similar to that of register 20. Stages 0–3, 6, 7, 9, 15–17 have additional feedback inputs. Digits $y_j$ are received from register 20 by stage 0 during the phases 1 in pass 1. In phase 2, the data in stage 0 is fed back over line 70 to each of stages 0–3, $6, 7, 9, 15–17$, where it is combined by modulo 2 addition with the data already stored in those stages. The feedback (F) is triggered by a pulse from counter 28 (terminal $\phi_2$) through gate 72 (the function of which will be discussed below), inverter 74 (FIG. 7) and gate 76. In phase 3 the data in register 52 is cyclically shifted one stage to the right by the same pulse that shifts register 20. In phase 0 register 52 is unchanged.

Register 52, by virtue of its feedback connections and the fact that the syndrome digits $s_j$ are interdependent, effectively computes all 63 syndrome digits $s_j$ even though it has only 18 stages. Furthermore, since $s_K$ is fully determined by the first KK received digits $y_j$, $s_K$ will appear in stage 0 in phase 3 after receipt of $y_K$. At this time, and throughout the rest of pass 1 and all of pass 2, the $C_1C_2$ counter 80 counts to determine the longest run of zero syndrome digits. All $s_j$ for $K \leqslant j \leqslant N-1$ are thus scanned twice by counter 80 (once in pass 1 and once in pass 2) so that a run of zeros spanning $s_K$ will be recognized.

At the completion of pass 1, switch 50 opens, since all the received digits have been fed to register 52. The received data continues to cycle around register 20 during pass 2.

Counter 80 (FIGS. 4, 6, 8) consists of two counters, $C_1$ and $C_2$, each having four flip-flop stages 82, 84. Counter $C_1$ begins counting (all counting occurs during phase 2) with the first zero $s_j$, $j \geqslant K$ in pass 1. This counting is triggered through terminal $C_1{}^+$, by the output of nor gate circuit 90 (FIG. 4) which is in turn the combination of two parallel nand gate circuits 92, 94. The output of gate 90 is a logical 0 only when either all the inputs to gate 92 are 1, or when all the inputs to gate 94 are 1. Inspection of the inputs to gate 92 will show that during pass 1 they will all be 1 whenever $j \geqslant K$ and $s_j=0$ during phase 2. During pass 2, gate 94 similarly controls advancement of the $C_1$ counter. The input to gate 94 from terminal $f$ of counter 28 is always 1 except when a string of zero syndrome digits begins with $j \geqslant K$, since strings wholly contained between positions K and $N-1$ are not to be considered.

When the $C_1$ counter reaches the end of a string of $s_j=0$, it stops advancing, and its count is immediately (in phase 2) fed into counter $C_2$ through lines 100. This is accomplished by triple nor gate circuit 102 (FIG. 4). Circuit 102 includes nand gate 104 (used to clear counter $C_2$ at the completion of the decoding as explained below), parallel nand gate circuit 106, (used in pass 3 as explained below), and parallel nand gate circuit 108 which transmits a logical 0 pulse to the $C_1 \rightarrow C_2$ terminal of counter 80 when $s_j=1$ in pass 2, phase 2, thus causing immediate advancement of counter $C_2$ to the count of counter $C_1$. Of course, such a count transfer never occurs during pass 1, since any string of $s_j=0$ ending in pass 1 is wholly contained between positions K and $N-1$ and is not considered. Furthermore, when such a string of zeros ends in pass 1, counter $C_1$ must be reset to zero. This is accomplished by parallel nand gate circuit 110 (FIG. 4) which transmits a pulse to the $C_1{}^0$ terminal of counter $C_1$ whenever $s_j=1$ during pass 1, phase 2, with $j \geqslant K$, as will be seen by inspection of the inputs to gate 110.

When a second string of $s_j=0$ begins, counter $C_2$ effectively counts backward from the count of $C_1$ until it reaches zero or the second string ends (actually, counter $C_2$ counts in terms of the complement of the $C_1$ count, rather than strictly backward). This is accomplished through the $C_2{}^-$ terminal of counter $C_2$, controlled by parallel nand gate circuit 120. As can be seen, gate 120 cannot pulse during pass 1 or when the $C_2$ count is zero (at which time the $\overline{C_2{}^0}$ terminal of counter 80 is in the logical 0 state). During this countdown of $C_2$, further advance of counter $C_1$ is prevented by the connection of the $\overline{C_2{}^0}$ terminal of counter 80 to an input of gate 94 through inverter 122.

If the second string of $s_j=0$ ends before counter $C_2$ reaches zero, counter $C_2$ is again set to the state of counter $C_1$ through gate 108. If, however, counter $C_2$ reaches zero, it can be seen that counter $C_1$ will resume advance under control of gate 94 until the string ends.

The above process is repeated until by the end of pass 2 counter $C_1$ will reflect the length of the longest string of $s_j=0$ not wholly contained within positions K to $N-1$.

The actual decoding occurs during pass 3. At the start of pass 3 input 61*a* of nand gate 61 of register 20 goes to a logical zero state to prevent further cycling around of the received digits during shifts of register 20, so that at the close of pass 3 the register will be clear. The digits $y_j$, $\overline{y_j}$ are respectively successively fed to nand gates 130, 132, where $y_j$ is either corected or transmitted unchanged. This is accomplished as follows.

Register 52 continues to generate the syndrome digits $s_j$ during pass 3. As soon as some $s_j=0$, counter $C_2$ is caused to be set to the value of counter $C_1$ by gate 106. If a string of $s_j$—0 continues, counter $C_2$ counts down under control of gate 120. If the string ends before $C_2$ reaches zero, counter $C_2$ is again reset at the start of the next $s_j=0$ string and again counts down, until finally the longest sring is reached and, at its end, counter $C_2$ reaches zero. At this poit, as discussed earlier, it is known that the beginning of the error burst in the received digits has been reached up to this point, nand gate 140 (FIG. 4) has been maintained at logical one output, since its terminal 140*a* is at logical zero until the $C_2$ count is zero; since the output of gate 140 is fed through inverter 142 to gate 130, terminal 130*a* will be held at logical 0 and terminal 132*a* of gate 132 at logical 1; the output of gate 133 will thus be 0 for $\overline{s_j}=1$ and 1 for $\overline{s_j}=0$. However, when $C_2$ reaches zero, terminal 140*a* becomes logical 1 and gate 140 has an output of logical zero for all subsequent $s_j=1$. Thus, the terminal 123*a* is held at 9, and 130*a* at 1, so that the output of gate 133 is 0 when $s_j=1$ and 1 when $s_j=0$, accomplishing the desired correction.

As soon as counter $C_2$ reaches zero in pass 3, the output of gate 73 (FIG. 4) becomes logical 0, and that of gate 72 logical 1, cutting off feedback in the syndrome register 52 during the correction portion of the decoding.

The main counter 28 (FIG. 5) has three major purposes: first to keep track of which received digit $y_j$ is being operated on; second to provide four phases ($\phi_0$, $\phi_1$, $\phi_2$, and $\phi_3$) sequentially in time for each digit; and third to keep track of the number of passes $P_1$, $P_2$, $P_3$ through the code word being operated on. The top six flip-flops in the diagram keep track of $j$, the bottom leftmost two keep track of the phase, and the bottom rightmost two keep track of the pass number and provide a clearing and loading pulse through output terminal CL after pass 3. The twelve flip-flops are mounted on three boards A, B, and C, four to a board, with the numeral in FIG. 5 following each A, B, and C, indicating the positions of the flip-flop on its respective board.

For the particular code being treated here, the block length is 63 and $j$ goes from 0 to 62. It can be seen from the diagram that the clock pulse after phase 3 of $j=62$ changes the phase to 0 and $j$ to 63 which immediately resets $j$ to zero. A code of an arbitrary block length N can be handled by adjusting the number of stages in the upper counter and by revising the nand gate circuitry above the upper counter to reset $j$ to zero when $j=N$.

Flip-flop A3 keeps track of whether the digit $y_j$ being operated on is an information digit or a check digit, or in this case whether $j$ is greater than or equal to 45. The nand gate circuitry computing $j=45$ can also be revised for an arbitrary number of information digits, K.

Finally, flip-flop B3 keeps track, during pass 2, of whether there have been any occurrences of $s_j=1$ for $j \geqslant K$.

At the completion of pass 3, register 20 will be clear. The clearing and loading pulse will load a new block into register 20, while simultaneously setting counter $C_1$ to zero through gates 71 and 111 (FIG. 4), and clearing register 52.

For different values of N and K, the modifications in these circuits are almost trivial. The number of stages in the received data register is N, the number of stages in the syndrome register is $N-K$, and the feedback connections in the syndrome register are the coefficients of $g(t)$. Finally the nand gates calculating N and K in the main counter are changed and counters $C_1$ and $C_2$ must have eough stages to count to $N-K-b'$.

Figure 9:
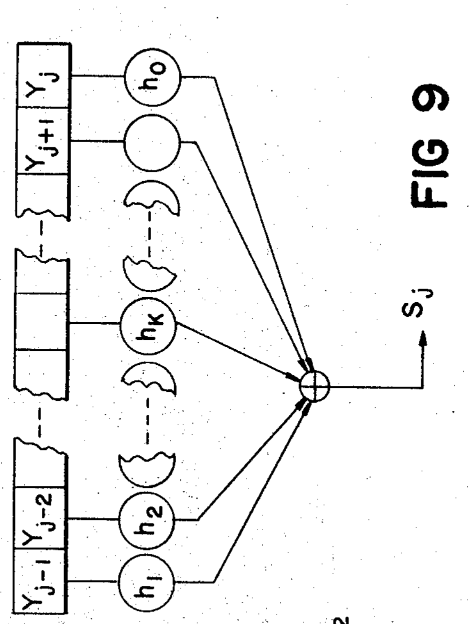
FIG. 9 is a diagram showing an alternate arrangement for calculating syndrome digits.
Figure 6:
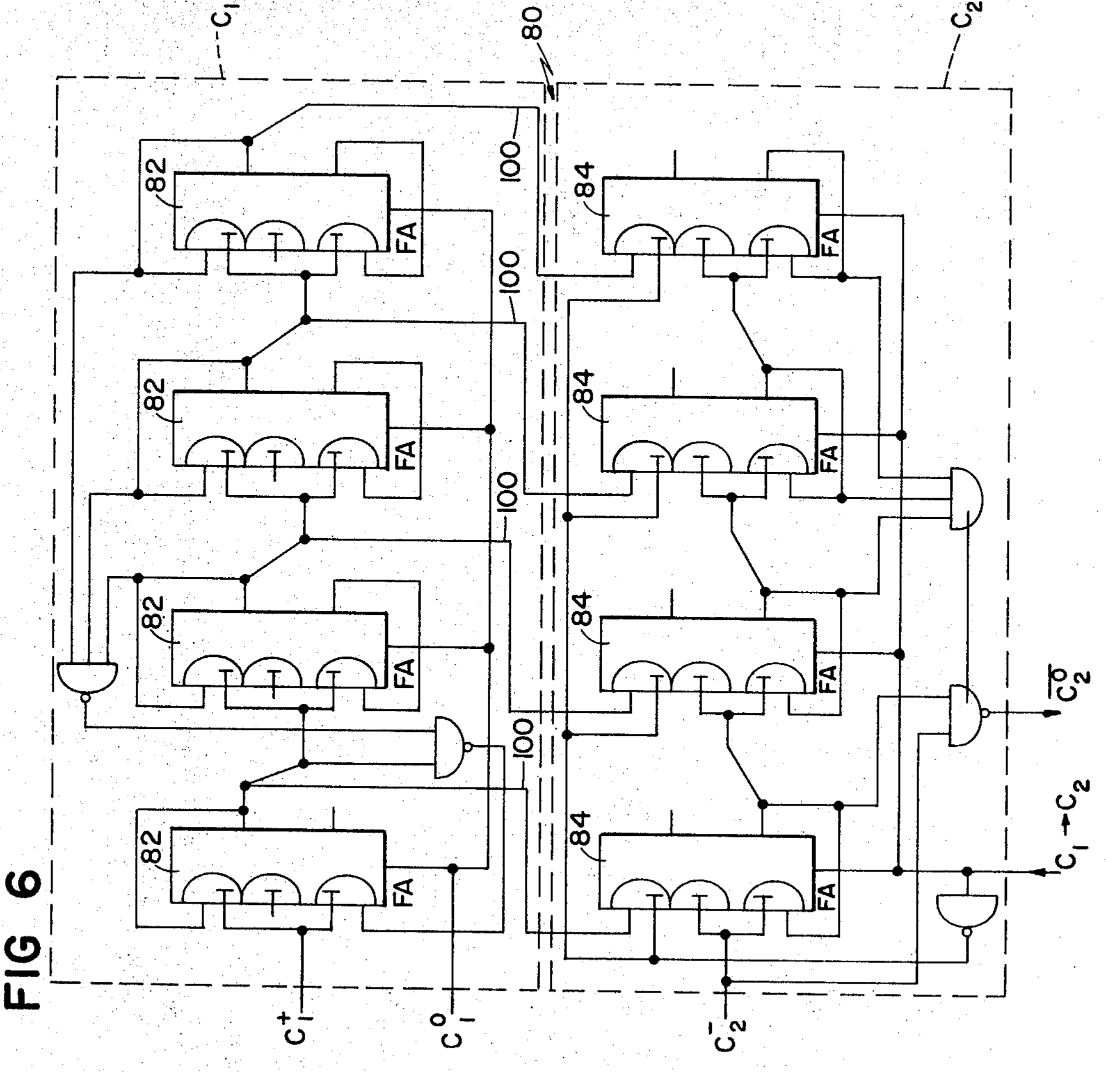
FIG. 6 is a circuit diagram of the $C_1C_2$ counter component of the circuitry of FIG. 4.
Figures 7, 8:
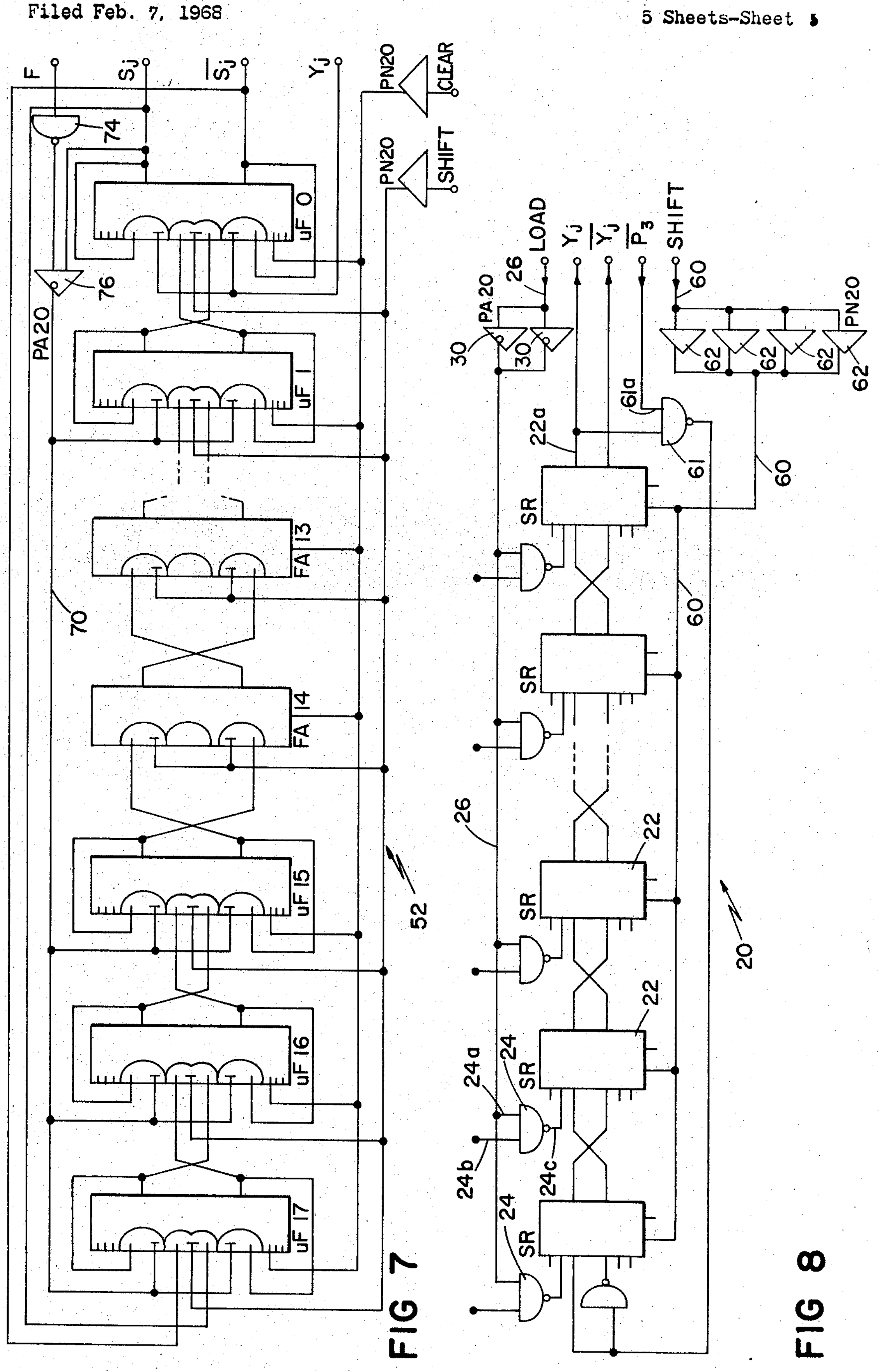
FIG. 7 is a circuit diagram of the syndrome register component of the circuitry of FIG. 4.
FIG. 8 is a circuit diagram of the received data register component of the circuitry of FIG. 4.

An alternate realization is to calculate the coefficients of $s(t)$ from (4) directly as shown in FIG. 9. The decoding could then be done in two passes instead of three and the syndrome register could be eliminated. Such a realization would be preferable if a recirculating delay line was used in place of the information register and would also be preferable for low rate codes with $K \leqslant N-K$.

For non-binary cyclic codes, either realization could be used but the detailed circuit diagram would be radically changed to provide storage and arithmetic in the relevant Galois field.

Other embodiments will occur to those skilled in the art and are within the following claims.

I claim:

1. A burst error correcting decoder for a cyclic block (N,K) code comprising means for receiving blocks, means for producing the N digit syndrome sequences for said received blocks, logic means for evaluating the syndrome sequences, and combining means responsive to said logic means and adapted to linearly combine syndrome digits with respective digits of said received blocks, characterized in that said logic means comprises a locator constructed and arranged to locate and select an appropriate run of consecutive zero syndrome digits in each said syndrome sequence, said runs including at least some runs shorter than $N-K-b'$, wherein $b'$ is the maximum guaranteed correctable burst length of the code and means responsive to said locator means to cause said combining means to combine those syndrome digits which immediately follow said selected run of zeros with respective received digits.

2. The decoder of claim 1 wherein said locator is constructed and arranged to select the longest run of consecutive zero syndrome digits not wholly contained between positions K and $N-1$ inclusive in a given syndrome sequence.

3. The decoder of claim 2 characterized in that said logic means comprises a plurality of cooperating counters, a first of said counters adapted to produce a count by ordinary arithmetic related to the length of a first run of zeros encountered in said syndrome sequence, and a second counter adapted to receive said count and to count down from aid count in stepped relation to the length of a second run of zeros, and to generate an indication if the count is fully counted down within the length of said second run, whereby it can be determined which of said runs is longer.

4. The decoder of claim 3 characterized in that said first counter is responsive to said indication to resume counting in relation to the remaining portion of said second run, whereby its count is the length of the longer of the two runs of zeros in said syndrome sequence, and said second counter is adapted to repeat its count-down procedure for successive runs of zeros, whereby the ultimate count in the first counter is the length of said longest run.

5. The decoder of claim 2 characterized in that said locator is constructed and arranged to select said run by evaluating said syndrome digits in the order of their appearance in said sequence, beginning with a given syndrome digit, including two passes through at least a portion of said syndrome digits containing said given digit.

References Cited

UNITED STATES PATENTS

| | | | |
|---|---|---|---|
| 3,155,818 | 11/1964 | Goetz | 235—153 |
| 3,317,716 | 5/1967 | Ducote | 235—92 |
| 3,376,408 | 4/1968 | Cogar | 235—177 X |
| 3,391,342 | 7/1968 | Gordon et al. | 235—92 X |
| 3,418,629 | 12/1968 | Chien | 340—146.1 |
| 3,437,995 | 4/1969 | Watts | 340—146.1 |

OTHER REFERENCES

W. W. Peterson; Error-Correcting Codes, MIT Press & John Wiley & Sons, 1961, pp. 183–200.

MALCOLM A. MORRISON, Primary Examiner

C. E. ATKINSON, Assistant Examiner

U.S. Cl. X.R.

235—92, 153

UNITED STATES PATENT OFFICE

CERTIFICATE OF CORRECTION

Patent No. 3,542,756 Dated November 24, 1970

Inventor(s) Robert Gray Gallager

It is certified that error appears in the above-identified patent and that said Letters Patent are hereby corrected as shown below:

Column 1, line 30, "and" should read -- a --; line 32, after "block" insert -- length --. Column 2, line 61, "-1." should read -- -1; --; line 33, after "$x_{N-1}$" insert -- $t^{N-1}$ --; line 25, "cide" should read -- code --. Column 3, l: 17, "sj" should read -- $s_j$ --; line 45, "$e_{L+j}-h_i$" should read -- $e_{L+j-i}h_i$ --; line 49, "$e_{L+b}-1$" should read -- $e_{L+b-1}$ --; line 70, "reecived" should read -- received --. Column 4, line 4, "probably" should read -- probable --; lin 32, "63" should not be bold face; line 54, "$\phi_3$" should read -- $\emptyset_3$ --. Column 5, line 13, "KK" should read -- K --. Colu 6, line 20, "$S_{j-o}$" should read -- $S_{j=o}$ --; line 24, "sring" should read -- string --; line 25, "poit" should read -- poi --; line 27, "reached up" should read -- reached. Up --. Column 7, line 10, "eough" should read -- enough --; line 38 after "code" insert a comma. Column 8, line 7, "aid" should read -- said --.

Signed and sealed this 4th day of May 1971.

(SEAL)
Attest:

EDWARD M.FLETCHER,JR.
Attesting Officer

WILLIAM E. SCHUYLER, J
Commissioner of Patent